(12) United States Patent
Li et al.

(10) Patent No.: US 7,417,328 B2
(45) Date of Patent: Aug. 26, 2008

(54) EXTERNAL POWER RING WITH MULTIPLE TAPINGS TO REDUCE IR DROP IN INTEGRATED CIRCUIT

(75) Inventors: Ken-Ming Li, Santa Clara, CA (US); Saleh M. Abdel-hafeez, Santa Clara, CA (US)

(73) Assignee: VIA Technologies, Inc., Taipei (TW)

( * ) Notice: Subject to any disclaimer, the term of this patent is extended or adjusted under 35 U.S.C. 154(b) by 865 days.

(21) Appl. No.: 10/032,686

(22) Filed: Oct. 23, 2001

(65) Prior Publication Data

US 2004/0211982 A1    Oct. 28, 2004

(51) Int. Cl.
*H01L 23/48* (2006.01)
*H01L 27/10* (2006.01)

(52) U.S. Cl. .................. 257/786; 257/207; 257/208; 257/691

(58) Field of Classification Search ......... 257/202–211, 257/691, 758, 786, E23.153; 438/128, 129, 438/309, 587, 598
See application file for complete search history.

(56) References Cited

U.S. PATENT DOCUMENTS

| | | | | |
|---|---|---|---|---|
| 5,691,218 A | * | 11/1997 | Colwell et al. | 438/128 |
| 5,742,099 A | * | 4/1998 | Debnath et al. | 257/758 |
| 5,760,428 A | * | 6/1998 | Colwell et al. | 257/206 |
| 5,838,204 A | * | 11/1998 | Yao | 331/1 R |
| 5,917,230 A | * | 6/1999 | Aldrich | 257/532 |
| 6,078,068 A | * | 6/2000 | Tamura | 257/203 |
| 6,093,942 A | * | 7/2000 | Sei et al. | 257/203 |
| 6,177,691 B1 | * | 1/2001 | Iranmanesh et al. | 257/211 |
| 6,259,158 B1 | | 7/2001 | Usami | |
| 6,362,497 B1 | * | 3/2002 | Hiraga | 257/203 |
| 6,407,939 B2 | * | 6/2002 | Merritt | 365/51 |
| 6,476,505 B2 | * | 11/2002 | Nakamura | 257/786 |
| 6,489,688 B1 | * | 12/2002 | Baumann et al. | 257/786 |

* cited by examiner

*Primary Examiner*—Hung Vu
(74) *Attorney, Agent, or Firm*—James W. Huffman (57) ABSTRACT

A power bus for use in an IC is disclosed that is configured as a grid and further formed using strips formed on I/O pads such as data I/O and multi-level voltage I/O pads. An IC is disclosed comprising a power supply I/O pad and a data I/O pad which are made of a deposited conductor. The power supply I/O pad is connected to a power bus and the data I/O pad is connected to circuitry. A strip of deposited conductor is formed closely adjacent to the data I/O pad wherein the strip is connected to the power bus. Parallel paths are developed within the integrated circuit to distribute power within the circuit. A similar approach is taken with respect to multi-level I/O pads. The power bus provide for reduced IR drops and better power supplies to core logic within an integrated circuit.

51 Claims, 4 Drawing Sheets

Fig. 1

( Prior Art )

Fig. 2

(Prior Art)

EXTERNAL POWER RING WITH MULTIPLE TAPINGS TO REDUCE IR DROP IN INTEGRATED CIRCUIT

FIELD OF THE INVENTION

The present invention relates to the field of very large scale integration (VLSI) integrated circuits (ICs). More particularly, the present invention relates to a manner for providing power busses to an IC while reducing IR drops in a core of the IC.

BACKGROUND OF THE INVENTION

Complementary Metal Oxide Silicon (CMOS) technology has played an increasingly important role in the integrated circuit (IC) industry. Over the years, the technology has improved to the point that CMOS technology clearly holds center stage as the dominant VLSI technology. CMOS VLSI technology provides a large number of transistors and input/output (I/O) interfaces on an IC, sometimes called a chip, with extremely high operating speed. These advances in CMOS VLSI technology and especially in fabrication and manufacturing technologies have been driven by the reduction and downsizing of device dimensions.

A number of enhancements may be added to the CMOS processes, primarily to increase routability of circuits, provide high quality capacitors for analog circuits and memories, or provide resistors of variable characteristics. Such enhancements includes providing two or more metal layers or double or triple polycrystalline layers. Notably, present technology provides seven or more layers of metal which can be used as signal and power-routing layers. These additional layers ease the routing of signals between modules and improves the power and clock distributions to modules. Improved routability is achieved through additional layers of metal or by improving the existing polysilicon interconnection layer.

In CMOS technology, three types of interconnects are used: diffusion, polysilicon and metal. Ten years ago a second metal layer became very important in CMOS design. The use of seven or more metal layers provides even more improvements over two layers. Aluminum (Al) and copper (Cu) as well as other metals and alloys known in the art can be used as interconnect metals. If some form of planarization is employed, other metal layer pitches can be the same as the first. As the vertical topology becomes more varied, the width and spacing of metal conductors has increased such that the conductors resist thinning and breaking between vertical topologies.

Contacting a first metal layer to a second or higher level metal layer is achieved by a via. When a further contact to diffusion or polysilicon is required, a separation between the via and the contact cut may be required. To do so, a first level metal tab is used to bridge between the second layer metal and the first layer metal. Processes typically require metal borders around a via on both levels of connection to metal layers. These metal borders assure proper connection to the metal layer and avoid potential intermittent contacts.

Most ICs with a large number of transistors and extremely high operating speed with a large count of I/O signal interfaces are subject to core power supply voltage IR drops, if they are not handled and measured properly. Note here that "I" corresponds to current and "R" corresponds to resistance. A product of I and R yields the resulting voltage drop associated with the current and resistance. The term IR is used in the art, however, as it draws a designer to consider in the mind of considering both current and resistance effects in reducing supply voltages in an IC. The downsizing of device dimensions results in increased performance, reduced cost and increased life cycle. However, such downsizing makes IR drops even more of a concern as it is critical that power to the IC is maintained stable and within a very narrow range. In a typical IC situation, the number of I/O interfaces is fixed the power consumption and heat generation increases due to the increased functionality and its associated increase in transistors. Moreover, undesirable IR drops become even more serious in low-voltage supply applications. For example, where an IC is operating at 1.8 volts, even a small IR drop can cause the IC to fail. Then, even a noisy power supply can cause the IC to fail for such a low operating voltage.

SUMMARY OF THE INVENTION

Accordingly, it is an object of the invention to reduce undesirable IR drops at the core of an integrated circuit. Furthermore, it is an object of the invention to reduce IR drops while not occupying more interface pins. Furthermore, it is an object of the invention to reduce IR drops while not deteriorating the performance of the integrated circuit.

These and other objectives are achieved in the present invention by providing power to an integrated circuit using a power bus and strips formed on input/output (I/O) pads such as data I/O and multi-level voltage I/O pads. In an exemplary embodiment of the invention, an integrated circuit is disclosed which comprises a power supply I/O pad and a data I/O pad which are made of a deposited conductor. The deposited conductor is typically a metal such as aluminum (Al), tungsten (W) or other conductors known in the art. The power supply I/O pad is connected to a power bus and the data I/O pad is connected to circuitry within the integrated circuit. Moreover, a strip of deposited conductor is formed substantially adjacent to the data I/O pad wherein the strip of conductor is connected to multiple points on the power bus. In this manner, multiple parallel paths are developed within the integrated circuit to distribute power within the circuit. In another embodiment of the invention, a similar approach is taken with respect to multi-level voltage I/O pads.

In another embodiment of the invention, a power bus is provided as a grid of intersecting conductive traces. Through this grid, distances to core logic are significantly decreased and, therefore, detrimental IR drops are also significantly reduced. In another embodiment of the invention, positive and negative power busses are provided on different levels of a multiple metal layer IC. In providing negative and positive power busses on different layers, another embodiment of the invention, configures such busses as parallel traces so as to increase the associated coupling capacitance. This increased coupling capacitance improves the integrity of the power delivered to the integrated circuit by minimizing the effects of noise on the power supply. Still another embodiment of the invention, provides the power busses on the lowest levels of a multiple metal layer integrated circuit. By providing the power busses at the lower levels, shorts and other damage that can occur during a wire bonding process are avoided because the concentrated pressures associated with wire bonding are worst near the top layers, but sparsely distributed at the lower layers.

The present disclosure provides an integrated circuit having an improved power bus with reduced IR drops in the supply power to the integrated circuit. Moreover, the present invention provides a power bus that reduces noise on the power bus itself. Advantageously, manufacturability, testability and reliability are not compromised in the power bus of the present invention. These and other advantages will be clear upon understanding of the drawings and detailed description below.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

A. Development of VLSI Technology

New microprocessors, sometimes called central processing units (CPUs) are continually being developed with higher clock frequencies and increased functionality. Illustratively, reduced instruction set computing (RISC) architectures introduced complexities into interconnect and packaging systems where the input/output (I/O) timing issues at high clock frequencies need to be addressed. Dynamic random-access memory (DRAM), static random-access memory (SRAM), and electrically programmable read-only memory (EPROM) devices with increasing memory capacity and decreasing data access times are keeping pace with the rapid microprocessor development. In large part, it has been these microprocessors and memories that have driven IC device technologies. The rate of introduction of these IC components has increased over recent years as competition between manufacturers intensifies. Early introduction of new IC products enables system manufacturers to evaluate the capabilities of these IC components in their own systems. This gives system manufacturers an early start to market their systems with new features to satisfy market demands. To meet the speed/performance challenge, complementary metal-oxide semiconductor (CMOS) device technology is transitioning into newer technologies such as bipolar CMOS (BiCMOS). This technology is a combination of CMOS and bipolar device technologies. In order to meet the challenges of increased speed and functionality, design and process technologies have migrated to sub-micron technologies.

B. Multilevel Interconnect Design

Multilevel interconnect design has become very complicated as integrated circuits have increased in complexity and size. The challenge in interconnect design is to maximize circuit performance. This may be accomplished by minimizing propagation delays and optimizing interconnect line layout on a die. Both requirements must be satisfied simultaneously without compromising either one.

Propagation delays due to parasitic capacitances from interconnects are one of the main causes for compromising speed performance in advanced ICs as interconnect dimensions are scaled down. Moreover, increases in die size increase interconnect lengths significantly, which results in higher interconnect resistance and capacitance. These very long interconnect lengths provide undesirable IR drops that reduce supply voltages to the IC circuitry and especially core IC circuitry. Innovations in design techniques and the use of electrically superior interconnect and dielectric materials are needed to reduce propagation delays and IR drops.

Interconnect layouts reflect a designer's skill in manipulating available die area by using design rules and packing density to connect all necessary components on a die. Predesigned and tested circuit building blocks and powerful computer-aided design (CAD) tools help reduce design effort and expedite turnaround of designs for manufacturing. Algorithms are written to determine the best routing scheme for interblock and intrablock connections. Interconnect layout design is done within the framework of design rules formulated for a given device. These design rules ensure that products are functional within the limits specified. The product and process requirements must be balanced when defining design rules for products. Feedback from process development, manufacturing, and reliability groups is constantly sought to ensure design rules are not violated. If design rules are violated due to process margins then the implications need to be carefully evaluated.

An objective of IC design is to develop designs that provide desired device applications without reducing their degree of manufacturability. It is more profitable to develop designs that are conducive to high-volume manufacturing. While being manufacturable, designs must also be testable. Testability of designs at the development stage and the ability to debug design problems during the product sampling stage are essential. Importantly, turnaround time required to fix design problems prior to high-volume manufacturing is critical for success.

Interconnect layout affects many aspects of the entire IC design program. For example, if there are layout connectivity errors, then the device will not function properly. To test if any interconnect layout scheme yields functional circuits, layout extraction and verification methodologies must be developed. An interconnect layout scheme can also degrade the die yield and reliability during manufacturing as it may be more susceptible to higher defect density due to placement and routing of interconnects.

C. IC Cross-Section

Figure 1:
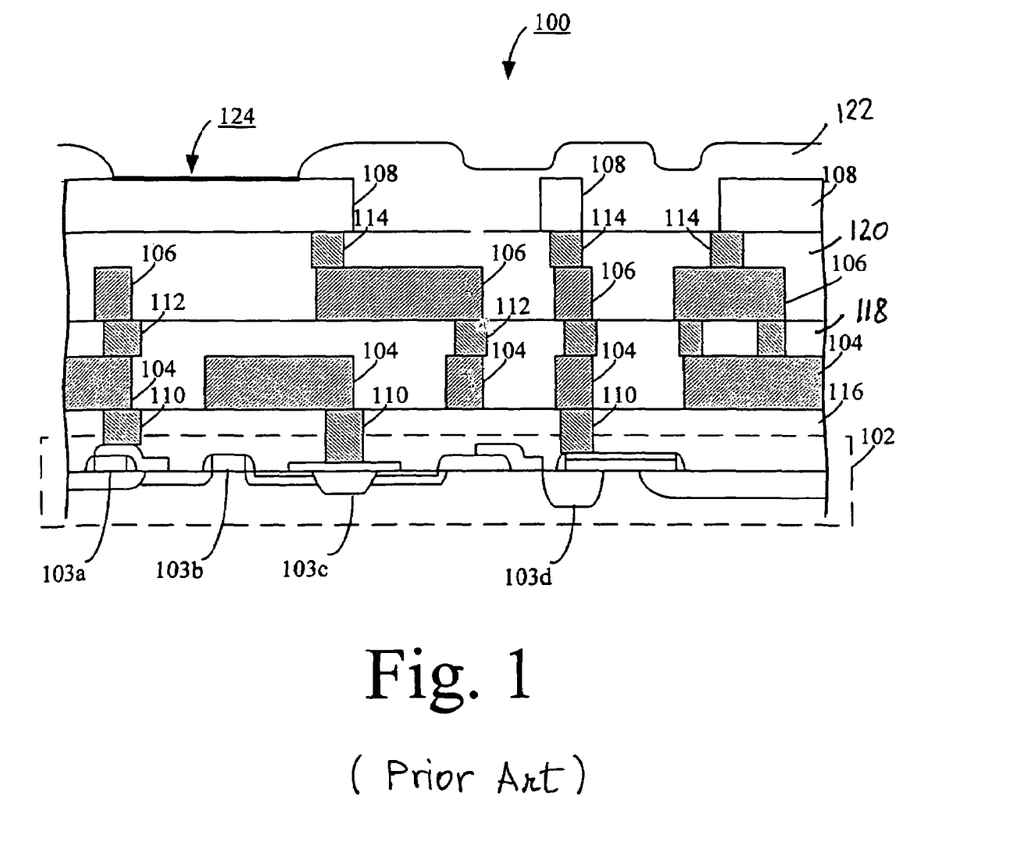
FIG. 1 is a cross-sectional view of a semiconductor device illustrating a multiple layer integrated circuit.

Integrated circuits can be divided into three areas including active regions, isolation regions, and interconnects. The present invention involves the inter-layer and intra-layer connection of metals deposited in layers within an integrated circuit. Within the active regions, an integrated circuit comprises transistors and other active devices grown on a semiconductor wafer. In order to make a functional circuit, it is important to connect various transistors and other active devices to each other in a predetermined manner. FIG. 1 is useful to gain an understanding of how semiconductor devices are grown on a semiconductor wafer and are connected using multiple layers of metals. As shown in FIG. 1, a number of semiconductor devices shown within box 102 have been grown on a semiconductor wafer; this area is part of the active region. Shown within box 102 are semiconductor devices 103a-d. Semiconductor devices 103a-d are grown on a semiconductor wafer using deposition techniques known to those of skill in the art. Each dielectric layer 116, 118, 120 and 122 is planarized to improve lithography and metal step coverage; these dielectric layers are part of the isolation region. Contacts 110 and vias 112, and 114 are opened in the dielectric layers and filled with a metal. In some implementations the vias are filled with tungsten (W) or Aluminum (Al), however, other metals are also appropriate. The metal layers comprise a stack of films with each layer having a specific application as no single layer can effectively satisfy all the stringent requirements for interconnect metalization. Metal contacts are deposited as a first layer of metal designated M1 104 in FIG. 1. Similarly, a second layer of metal M2 106 is deposited; finally, a third layer of metal M3 108 is deposited. It is the top layer, in this case the third layer, that is exposed to form pad 124. This pad 124, is subsequently used for placing bond wires which are in turn connected to package leads. As is known in the art, a barrier metal layer (not shown) is sometimes needed to prevent the aluminum from interacting with adjacent layers. Moreover, to reduce reflectivity of the metal layers, an antireflective coating (ARC) layer (not shown) is also used. If an ARC layer is not used, the highly reflective metal surface will distort ultraviolet (LTU) light which is typically used during a resist exposure process. This distortion can lead to bridging resist material and further lead to poor critical dimension control. Although the cross-sectional example described for FIG. 1 is limited in certain respects, one of skill in the art will understand how the three layer example shown with one bonding pad 124 can be extended to more layers of metal. For example, present technology is currently using upwards of seven (7) metal layers.

Note that hundreds of thousands of contacts 110 and vias 112 and 114 are provided on a die in order to provide connection paths between the many metal interconnects and semiconductor devices. In the processing of these vias, corresponding openings need to be made in the dielectrics 116, 118, 120 and 122. Note that the vias need to be placed precisely and any misalignment can be detrimental to the proper operation of an integrated circuit. Note how the vias and metals are not precisely aligned in FIG. 1 in order to illustrate this misalignment.

As CMOS technology migrates to submicron dimensions, we see some inherent limitations due to scaling becoming more important. Although device technologies have been scaled, power supplies are not similarly scaled because of increased system requirements. When the operating voltages are not scaled, the electric fields increase thereby causing reliability problems due to, among other things, the so-called hot carriers. The reason these carriers are called "hot" is because the electrons gain a significant amount of kinetic energy and inject themselves into the gate oxide to cause charge trapping. The impact of hot carrier degradation is in the form of transistor threshold voltage instability, gate oxide charging, and latch-up. Migration to lower operating voltages such as 1.8 volts reduces hot carrier problems to some extent, but issues associated with noise margin and drive capability remain. As interconnect and capacitive loads do not scale linearly, the drive current must be increased to gain further speed performance.

D. Downward Scaling

An ever-present challenge in IC design is to include more transistors on a single chip in order to offer customers a greater set of device features and applications. Downward scaling of feature sizes allows an increase in circuit speed and packaging density. This also decreases power dissipation. There are some notable negative effects of downward scaling on transistor, interconnect, and reliability parameters. These arise when the dimensions are scaled down and operating voltages are not, leading to various short-channel effects. In CMOS circuits, scaling can form parasitic bipolar transistors that may turn on and cause latch-up, which damages an IC.

As interconnect dimensions decrease and clock frequencies increase, resistance-capacitance (RC) time delays become the predominant barrier t speeds. Interconnect technology can be a bottleneck in realizing potential improvements in device speed, packing density, and reliability that stem from downward scaling of device parameters. From a design perspective, the scaling of interconnects presents a challenge to manage resistance and capacitance issues to maintain circuit speed. As device technologies get smaller, the current (I) and resistance (R) of the metal films pose severe limitations in achieving desired speed and stability performance specifications. This current (I) and resistance (R) problem is commonly called the IR drop problem. Of course, the IR product is a voltage drop (i.e., V=IR).

The reliability of interconnects is another major side effect of scaling down dimensions. Increased current density in narrow metal lines and a higher contact resistance make aluminum (Al) interconnects more susceptible to electromigration (EM), stress voiding and cracking failures as well as the above-mentioned IR drop.

To enhance device speed and increase packing density, transistor geometries are reduced. The primary objective during this reduction process is to ensure that the electric field patterns in the smaller devices are identical to those in the larger devices. Necessarily, the physical and electrical parameters of interconnects should be scaled down appropriately (recall that scaling results in an increase in electric fields) to keep the direction and magnitude of the electric field constant. The result is an increase in the speed of the device. In an ideal scaling situation, all geometries and operating voltages are scaled down by a scaling factor, 1/S, while the substrate doping is increased by S, where S is greater than 1. As a result of scaling, the electric fields remain approximately unchanged and consequently velocity saturation and carrier heating are prevented. In an ideal scaling situation, devices get faster, power dissipation and gate delay are reduced, and packing density improves.

Unfortunately, in real-world situations, operating voltages sometimes need to remain the same when scaling transistors. Operating voltages sometimes remain the same because a designer does not want or cannot change the operating voltages. For example, a designer may not want to change his design from 3.3 volts to 1.8 volts. In yet other situations, it may not be possible to scale down the voltage. For example, where 1.8 volts is being used, it may not be feasible to scale down the voltage even more.

E. Interconnect Resistance

Interconnections serve several functions on an IC and can be divided into two groups. First, local interconnects are used to wire a group of both active and passive elements in close proximity. Generally, these are thin and densely packed metal lines. Second, global interconnections are used to connect the various circuit elements. It is these interconnections that limit the integrity of the power supply to devices and to which the present invention is directed. The design rules for each of these considerations are different because of their diverse applications. The interconnections, besides carrying current to the active areas, also serve as an interface to the package metalization. The topmost metal lines that carry the bulk of the power are wider and thicker, thereby reducing resistance. The pitch and length of global interconnects are determined by the cell size and the layout required for each cell. Interconnect resistance increases as the length increases and cross-sectional area is reduced. Moreover, the cross-section of metal lines may be reduced as a result of process variations, causing interconnect resistance to increase. To increase transistor packing density, feature sizes are scaled down and the die size is increased. As the die size increases, so does the length of the global interconnection. Line length contributes to overall resistance and, accordingly, larger IR drops.

F. I/O Structures

Input and output structures, collectively called input/output (I/O) structures, require a large amount of circuit design expertise. An important consideration in I/O structures are pads and pad sizes. A major consideration in determining pad sizes is the minimum size for accommodating a bond wire which will ultimately be attached to the pad. A typical pad size is on the order of 100 to 150 square microns. Pads are typically designed to be "core-limited" or "pad-limited." In core-limited designs, the internal core of the chip determines the size of the chip such that thin pads are required. In such a design, the I/O circuitry is placed on either side of the pad. In a pad-limited design, the I/O circuitry is placed toward the center of the chip.

Figure 2:
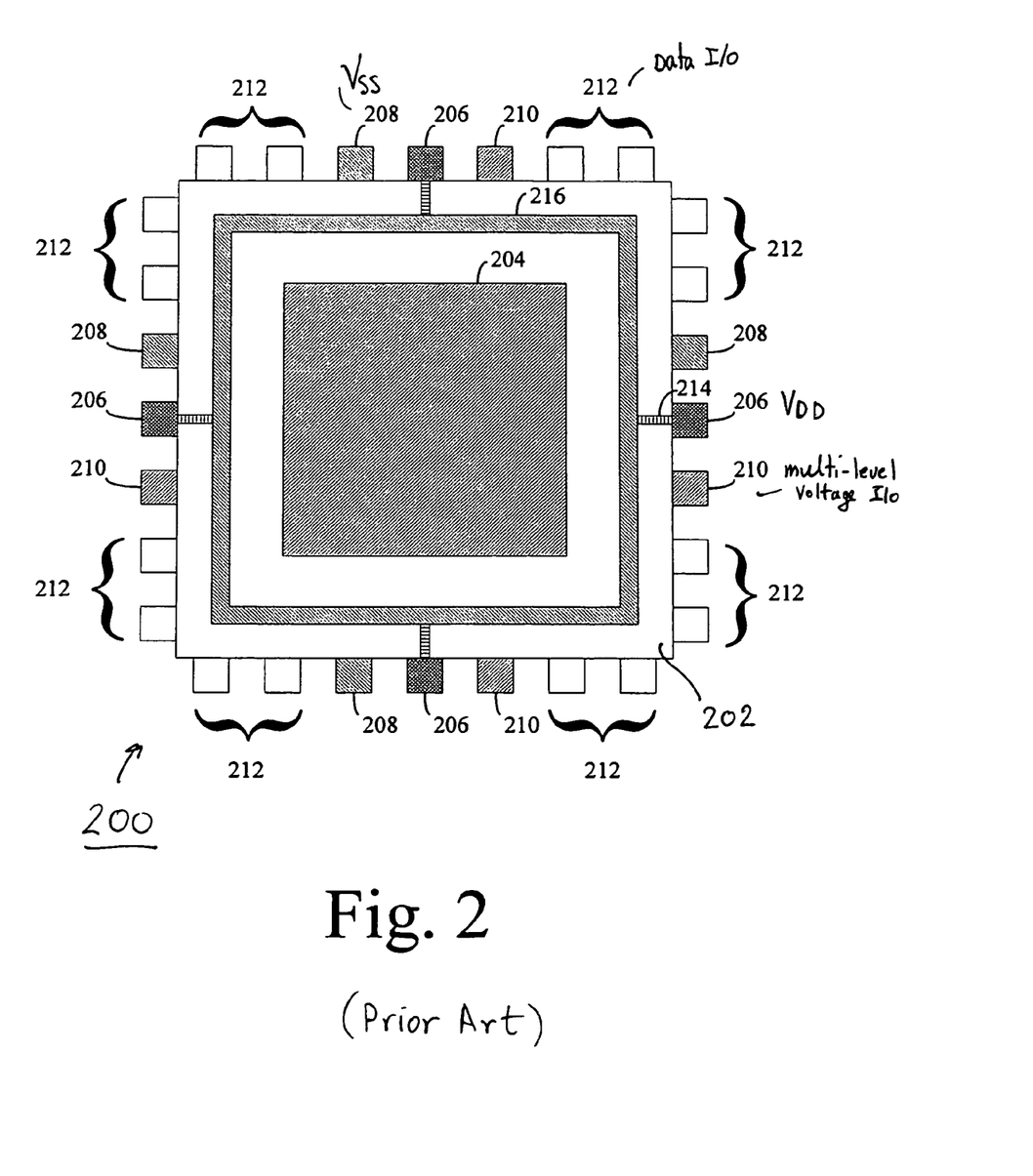
FIG. 2 is a top-view diagram of a packaged integrated circuit along with its input/output structures.

Input/output (I/O) connections on an integrated circuit can be divided into three types: power supply I/Os, multi-level voltage I/Os, and data I/Os. As shown in FIG. 2 an integrated circuit (IC) 200 contains a core logic 204 within a typically plastic or ceramic casing 202. Connections which are external to IC 200 are made through pins 206, 208, 210 and 212. As shown in FIG. 2, pins 206 provide the positive power supply to the core logic. This positive power supply is usually called $V_{DD}$. A connection from pin 206 is typically made using a metal trace 214 within IC 200. Moreover, a power bus 216 (not shown) is formed to surround core logic 204. Where core logic 204 needs $V_{DD}$, a connection is made from the power bus 216. Similarly, pins 208 provide the negative power supply to the core logic. This negative power supply is usually called $V_{SS}$. Throughout this disclosure voltages are sometimes described as positive or negative, however, it is important to note that this is done for clarity and convenience. One of skill in the art will understand that the positive and negative voltage being described are relative terms that can describe a voltage potential and can further describe the magnitude (i.e., absolute value) of a voltage potential. Accordingly, one of skill in the art would understand a positive voltage as a high voltage and a negative voltage as a low voltage. These and other variations are well understood by those of skill in the art. So as to prevent cluttering of FIG. 2, the negative power bus and its connections are not shown, however, the negative power bus is formed in a similar manner as the power bus. One of skill in the art understands that undesirable IR drops are at their worst at the center of the core logic. Intuitively this makes sense as it is the center of the core logic that is the farthest from the negative and positive power buses. Thus, associated resistances are at their highest and necessary current draw is also at its highest.

In developing an integrated circuit it is often necessary to interface one integrated circuit such as IC 200 with another IC that may be operating at a different voltage. For example, where the core logic of IC 200 operates at 1.8 volts, it may nonetheless be necessary for IC 200 to interface with other ICs operating at 3.3 volts or even 5 volts. Thus, multi-level voltage I/Os 210 provide the appropriate voltages to the various input buffers or input stages necessary for data I/Os 212. It is data I/Os that receive input and provide output to other ICs external to IC 200. One can therefore appreciate that as the functionality of IC 200 is increased, it is desirable to increase the number of data I/Os so as to interface all of its increased functionality. As discussed above, however, as functionality is increased, for example, through scaling, it is also necessary to reduce detrimental IR drops. A manner in which IR drops can be reduced is to increase the number of power supply pins 206 and 208. This results in a tradeoff between data I/Os and power supply I/Os. The present invention, however, eliminates or at least reduces the need to consider this tradeoff.

Power and ground bus widths may be calculated from a worst-case estimate of the power dissipation of a die and from a consideration of providing good supply voltages. Multiple power and ground pads can be used to reduce noise. Other designs place the lowest circuit voltage ($V_{SS}$) as the outermost track. $V_{DD}$ and $V_{SS}$ pads comprise a sandwich of the metal pad layers connected to an appropriate bus. A two-level metal process affords good crossovers, providing that a large number of vias are used in the connection. Preferably, separate internal $V_{DD}$ and $V_{SS}$ supply connections should be made to internal circuitry. Dirty and clean $V_{SS}$ connections should be ohmically connected in metal. I/O transistors should be constructed from paralleled smaller transistors.

G. Metal Strips on Data I/Os and Multi-Level I/Os

Figure 3:
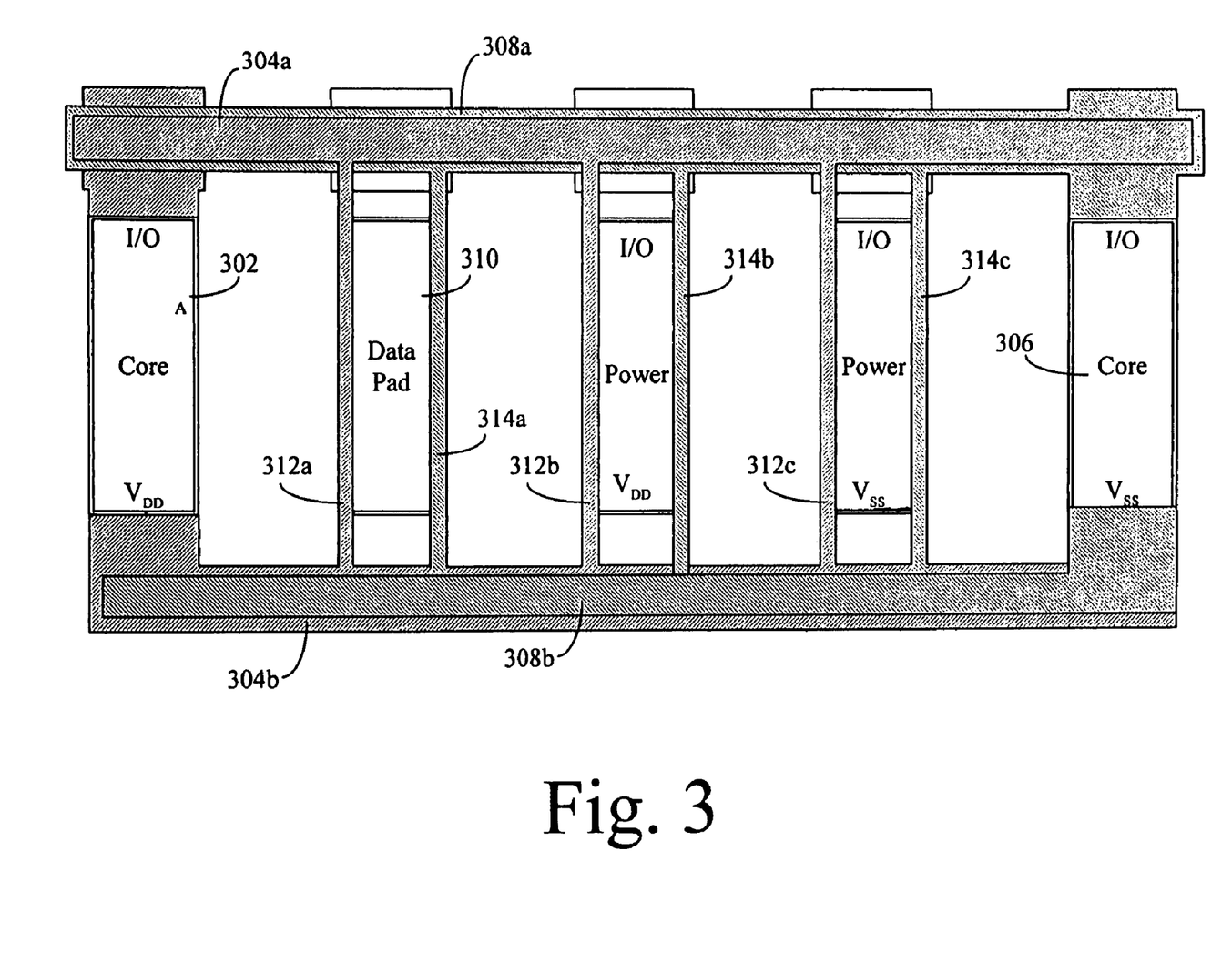
FIG. 3 is a diagram of a metal layer layout used to form buses from the data pads and multi-level voltage pads according to an embodiment of the invention.

The prior art attempted to reduce IR drops by providing more power supply pins and thereby providing parallel current paths to the core logic 204. The present invention avoids this cumbersome solution and instead makes use of the fact that data I/Os and multi-level voltage I/Os do not need to carry much current such that a narrower I/O pad remains and is fully functional. Although the three types of I/Os carry dramatically different amounts of current, they are allocated similar amounts of metal for their pads. As a solution to the IR drop problem, the present invention forms strips out of the outer portions of the pads for the multi-level voltage I/Os and the data I/Os. These strips are then connected to the positive and negative power supply buses used for $V_{DD}$ and $V_{SS}$. As shown in FIG. 3, $V_{DD}$ I/O pad 302 is used to provide positive power to the power buses 304a and 304b. Moreover, $V_{SS}$ I/O pad 306 is used to provide negative power to the power buses 308a and 308b. These connections can be made using methods known in the art. As further shown in FIG. 3, data I/O pad 310 is made similarly to $V_{DD}$ and $V_{SS}$ I/O pads 302 and 306, however, data I/O pad 310 can function properly with narrower metal contacts without detrimental effects. Accordingly, the present invention allocates strips 312a and 314a from the data contacts for parallel connections to the power buses 304a and 308a, respectively. Recall, that a prior art method of decreasing IR drops was to increase the number of power supply pins. The result of this prior art solution was to provide parallel paths for power to be supplied to the integrated circuit. The strips 312a and 314a just described provide a similar effect but without the need to dedicate more pins to power supply inputs. More pins are therefore available to accommodate increased functionality by allowing more data I/Os. As described, these strips 312a and 314a provide parallel connections between the power buses and therefore reduce IR drops at the core logic. Similar strips can be made on the positive and negative multi-level voltage pads so as to provide further parallel paths for the power supplies. These are shown as strips 312b, 314b, 312c and 314c, respectively.

H. Description of FIG. 4

Figure 4:
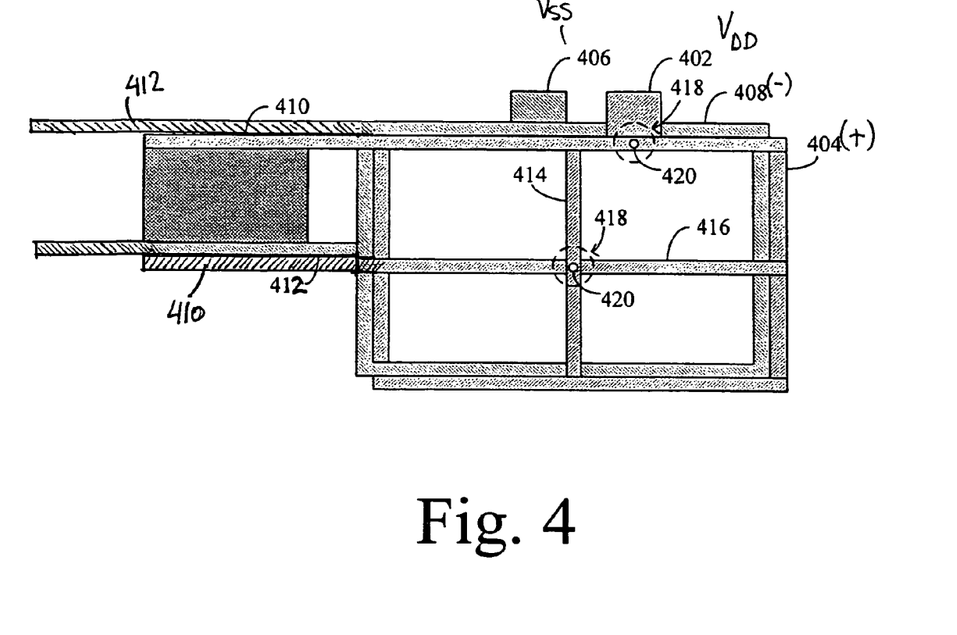
FIG. 4 is a diagram of a metal layer layout for a power bus using multiple metal layers according to an embodiment of the invention.

Detrimental or undesirable IR drops are further reduced in the present invention by providing a grid-type power bus that intersects at or near the center of the core logic. As shown in FIG. 4, a $V_{DD}$ I/O pad 402 connects to a positive power bus 404. The power bus 404 of the present invention differs from the prior art in that it is provided as an intersecting grid of conductive traces 414 and 416. As shown in FIG. 4, conductive traces 414 and 416 are formed in a vertical and horizontal manner such that they intersect at or near the center of the core logic shown as area 418 through vias 420. Whereas prior art buses provide a sometimes ineffective ring around the core logic, the present invention advantageously intersects at or near the center of the core logic thereby providing a significantly shorter path from the $V_{DD}$ power bus. Accordingly, the associated IR drop is advantageously less that in the prior art.

In an embodiment of the invention, the power bus 404 in the form of the grid is provided with many more intersecting vertical and horizontal traces. Accordingly, the center of the core logic as well as other parts of the integrated circuit are provided with many closely available paths to the $V_{DD}$ power bus 404. In yet another embodiment of the invention, a similar negative power bus 408 is provided through $V_{SS}$ I/O pad 406 to form a grid. The power strips described for FIG. 3 are further shown in FIG. 4 as $V_{DD}$ strip 410 and $V_{SS}$ strip 412. As previously described, these strips provide parallel current paths so as to reduce the detrimental or undesirable IR drops.

A further advantage of the present invention is that power buses 404 and 408 when arranged in parallel demonstrate an increased coupling capacitance. Such increased coupling capacitance is desirable on the power buses as it helps to provide cleaner and undistorted power. Further coupling capacitance can be achieved by providing power buses on multiple layers to provide a sandwich type coupling capacitance. For example, as shown on FIG. 5, $V_{DD}$ power buses can be provided at level 1 metal layer M1 452 and level 3 metal layer M3 456 and $V_{SS}$ power buses can be provided at level 2 metal layer M2 454 and level 4 metal layer M4 458. This sandwich-type capacitive effect further improves the integrity of the power supplied to the integrated circuit.

In the discussion of undesirable RC effects, infra, it was noted a large conductive trace can improve signals at high frequencies. Thus, when implementing the present invention, it is important to avoid reducing the conductive area of high frequency signal paths. Where low frequency signals are experience, however, the present invention does not provide any adverse effects. Furthermore, it should be noted that the multi-level voltage I/Os provide DC signals at very low currents such that a reduction in the conductive traces does not provide any adverse effects. Accordingly, the present invention is widely appropriate for multi-level voltage I/Os.

Figure 5:
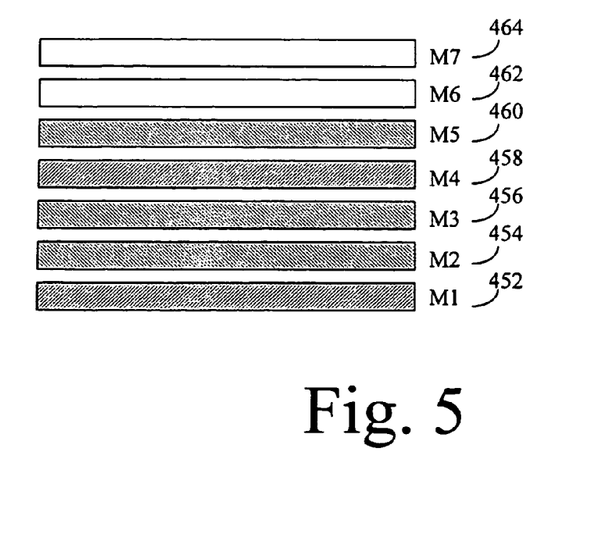
FIG. 5 is a legend depicting metal layer representations for a seven-layer metal layout with power buses according to an embodiment of the invention.

It has been found that reliability is improved and errors are reduced when the power buses are provided at the lowest metal layers within a multiple layer application. As indicated in FIGS. 4 and 5, $V_{DD}$ power bus 404 is provided at the second metal layer, M1 452, and the $V_{SS}$ power bus 408 is provided at the first metal layer, M2 454. Other layers are also appropriate, although embodiments of the invention avoid using the top-most layers (i.e., M7 464 and M6 462) as power buses. These layers are less desirable when bonding pressure applied at the I/O pads as it may cause shorts or other damage in the top most layers. Importantly, however, the present invention can be practiced on any layer. The guidance provided here relates to observations made by the inventors. Where issues related to wire bonding, applied pressure, and shorts are not a concern, the present invention can be practiced on the top layers. As the technology develops and these problems can be avoided, there is less concern with regard to shorts. Moreover, shorts can be avoided by avoiding metal directly below the pads. Layout and design rules can be specified in this situation to provide a fully functional circuit while avoiding shorts or other damage.

The teachings of the present invention are appropriate to other types of situations especially where parallel electrical paths can provide performance improvements.

The foregoing descriptions of specific embodiments of the present invention have been presented for purposes of illustration and description. They are not intended to be exhaustive or to limit the invention to the precise forms disclosed. Many modifications and variations are possible in light of the above teachings without deviation from the scope of the claims set out below. The embodiments were chosen and described in order to best explain the principles of the invention and its practical application, to thereby enable others skilled in the art to best utilize the invention and various embodiments with various modifications as are suited to the particular use contemplated.

What is claimed is:

1. An integrated circuit comprising:
    a power supply I/O pad;
    an I/O pad of a first type made of a deposited conductor, wherein the I/O pad of the first type is connected to a first point on an integrated circuit; and
    a strip of deposited conductor located alongside to the I/O pad of the first type, wherein the strip is connected to a second point on the integrated circuit;
    wherein the I/O pad of the first type is narrower than the power supply I/O pad order to make room for the strip.

2. The integrated circuit of claim 1, wherein the I/O pad of the first type is a data I/O pad or a multi-level voltage I/O pad.

3. The integrated circuit of claim 1, wherein the first point on the integrated circuit is further connected to a circuitry.

4. The integrated circuit of claim 1, wherein the first point on the integrated circuit is further connected to a power bus.

5. The integrated circuit of claim 4, wherein the power bus is configured as an intersecting grid of a deposited conductor.

6. The integrated circuit of claim 5, wherein the integrated circuit is comprised of multiple metal layers, and wherein the I/O pad of the first type and the power bus are deposited on different layers.

7. The integrated circuit of claim 6, wherein the power bus exists at a lowest layer.

8. The integrated circuit of claim 6, wherein the power bus exists at a second to lowest layer.

9. The integrated circuit of claim 1, wherein the second point on the integrated circuit is further connected to a circuitry.

10. The integrated circuit of claim 1, wherein the second point on the integrated circuit is further connected to a power bus.

11. The integrated circuit of claim 10, wherein the power bus is configured as an intersecting grid of a deposited conductor.

12. The integrated circuit of claim 1, wherein the strip of conductor is connected to a third point on the integrated circuit.

13. The integrated circuit of claim 12, wherein the second and third points on the integrated circuit are connected to a circuitry.

14. The integrated circuit of claim 12, wherein the second and third points on the integrated circuit are connected to a power bus.

15. The integrated circuit of claim 14, wherein the power bus is configured as an intersecting grid of a deposited conductor.

16. The integrated circuit of claim 1, further comprising:
    an I/O pad of a second type made of a deposited conductor, wherein the I/O pad of the second type is connected to a third point on the integrated circuit; and
    a second strip of deposited conductor, wherein the second strip is located alongside the I/O pad of the second type, and wherein the second strip is connected to a fourth point on the integrated circuit;
    wherein the I/O pad of the second type is narrower than the power supply I/O pad in order to make room for the second strip.

17. The integrated circuit of claim 16, wherein the I/O pad of the second type is a data I/O pad or a multi-level voltage I/O pad.

18. The integrated circuit of claim 16, wherein the third point on the integrated circuit is further connected to a circuitry.

19. The integrated circuit of claim 16, wherein the third point on the integrated circuit is further connected to a power bus.

20. The integrated circuit of claim 1, further comprising a second strip of deposited conductor located alongside the I/O pad of the first type, wherein the second strip is connected to a third point on the integrated circuit, and wherein the I/O pad of the first type is narrower than the power supply I/O pad in order to make room for the strips of deposited conductor.

21. The integrated circuit of claim 20, wherein the second, third and fourth points on the integrated circuit are connected to a circuitry.

22. The integrated circuit of claim 20, wherein the second, third and fourth points on the integrated circuit are connected to a power bus.

23. The integrated circuit of claim 22, wherein the power bus is configured as an intersecting grid of a deposited conductor.

24. The integrated circuit of claim 1, wherein the I/O pad of the first type provides data or a voltage level to a core circuitry.

25. An integrated circuit comprising:
a positive power supply I/O pad made of a deposited conductor;
a positive power bus connected to the positive power supply I/O pad;
a negative power supply I/O pad made of a deposited conductor;
a negative power bus connected to the negative power supply I/O pad;
an I/O pad made of a deposited conductor;
a first strip of deposited conductor located alongside the I/O pad, wherein the first strip is connected to multiple points on the positive power bus; and
a second strip of deposited conductor located alongside the I/O pad, wherein the second strip is connected to multiple points on the negative power bus;
wherein the I/O pad is narrower than the power supply I/O pads in order to make room for the first and second strips, respectively.

26. The integrated circuit of claim 25, wherein the power buses provide positive and negative power to a core circuitry.

27. The integrated circuit of claim 25, wherein the power buses are configured as intersecting grids of a deposited conductor.

28. The integrated circuit of claim 25, wherein the integrated circuit is comprised of multiple metal layers, and wherein the positive and negative power buses are deposited on third and fourth layers, respectively.

29. The integrated circuit of claim 25, wherein the integrated circuit is comprised of multiple metal layers, and wherein the positive and negative power supply I/O pads are deposited on a first layer and a second layer, respectively.

30. The integrated circuit of claim 29, wherein the negative power bus exists at the lowest layer.

31. The integrated circuit of claim 29, wherein the positive power bus exists at the lowest layer.

32. The integrated circuit of claim 29, wherein the negative power bus exists at the second lowest layer.

33. The integrated circuit of claim 29, wherein the negative and positive power buses are further deposited on a fifth layer and a sixth layer, respectively.

34. The integrated circuit of claim 29, wherein the positive power bus exists at the second lowest layer.

35. The integrated circuit of claim 29, wherein the negative power bus exists at the third lowest layer.

36. The integrated circuit of claim 29, wherein the positive power bus exists at the third lowest layer.

37. The integrated circuit of claim 29, wherein the negative power bus exists at the fourth lowest layer.

38. The integrated circuit of claim 29, wherein the positive power bus exists at the fourth lowest layer.

39. The integrated circuit of claim 25, wherein the I/O pad is a data I/O pad or a multi-level voltage I/O pad.

40. The integrated circuit of claim 25, wherein the I/O pad is configured to provide data or a voltage level to a core circuitry.

41. An integrated circuit comprising:
a power supply I/O pad;
an I/O pad of a first type, wherein the I/O pad of the first type is connected to a first point on the integrated circuit, wherein the I/O pad of the first type comprises:
a deposited conductor forming a metal contact; and
a strip of deposited conductor, wherein the strip is connected to a second point on the integrated circuit, wherein the strip of deposited conductor is positioned on an outer portion of the I/O pad;
wherein the deposited conductor forming the metal contact is narrower than the power supply I/O pad in order to make room for the strip of deposited conductor.

42. The integrated circuit of claim 41, wherein the I/O pad of the first type is a data I/O pad or a multi-level voltage I/O pad.

43. The integrated circuit of claim 41, wherein:
the deposited conductor forming the metal contact is positioned on an inner portion of the I/O pad.

44. The integrated circuit of claim 41, wherein the I/O pad further comprises a second strip of deposited conductor, wherein the second strip is connected to a third point on the integrated circuit.

45. The integrated circuit of claim 41, wherein the strip of deposited conductor is connected to a power bus, wherein the power bus is configured to provide power to a core circuitry of the integrated circuit.

46. An integrated circuit comprising:
a power supply I/O pad;
a pad comprising at least a first portion and a second portion, wherein the first portion of the pad includes an I/O pad of a first type made of a deposited conductor, wherein the I/O pad of the first type is connected to a first point on the integrated circuit; and
wherein the second portion of the pad includes a strip of deposited conductor, wherein the strip is located alongside the I/O pad of the first type, wherein the strip is connected to a second point on the integrated circuit, and wherein the I/O pad of the first type is narrower than the power supply I/O pad in order to make room for the strip.

47. The integrated circuit of claim 46, wherein the I/O pad of the first type is a data I/O pad or a multi-level voltage I/O pad.

48. The integrated circuit of claim 46, wherein the strip of deposited conductor is positioned on an outer portion of the pad.

49. The integrated circuit of claim 46, wherein:
the I/O pad of the first type is positioned on an inner portion of the pad; and
the strip of deposited conductor is positioned on an outer portion of the pad.

50. The integrated circuit of claim 46, wherein the pad further comprises a third portion, wherein the third portion of the pad includes a second strip of deposited conductor, wherein the second strip is located alongside the I/O pad of the first type, wherein the second strip is connected to a third point on the integrated circuit.

51. The integrated circuit of claim 46, wherein the strip of deposited conductor is connected to a power bus, wherein the power bus is configured to provide power to a core circuitry of the integrated circuit.

* * * * *